(12) United States Patent
Treciokas

(10) Patent No.: US 11,147,131 B2
(45) Date of Patent: Oct. 12, 2021

(54) LED DIMMER BULB USING MICROCONTROLLER AND AC MAINS TOGGLE SWITCH FOR POWER AND DIM CONTROL

(71) Applicant: Michael Gytis Treciokas, Ottawa (CA)

(72) Inventor: Michael Gytis Treciokas, Ottawa (CA)

(73) Assignee: Michael Gytis Treciokas, Ottawa (CA)

( * ) Notice: Subject to any disclaimer, the term of this patent is extended or adjusted under 35 U.S.C. 154(b) by 123 days.

(21) Appl. No.: 16/558,989

(22) Filed: Sep. 3, 2019

(65) Prior Publication Data

US 2020/0077480 A1 Mar. 5, 2020

Related U.S. Application Data

(60) Provisional application No. 62/727,539, filed on Sep. 5, 2018.

(51) Int. Cl.
*H05B 45/10* (2020.01)
*H05B 47/18* (2020.01)
*H03K 7/08* (2006.01)

(52) U.S. Cl.
CPC ............ *H05B 45/10* (2020.01); *H05B 47/18* (2020.01); *H03K 7/08* (2013.01); *Y02B 20/30* (2013.01)

(58) Field of Classification Search
CPC ...... H05B 45/10; H05B 47/18; H05B 47/185; H03K 7/08
See application file for complete search history.

(56) References Cited

U.S. PATENT DOCUMENTS

| | | | |
|---|---|---|---|
| 2011/0148318 A1* | 6/2011 | Shackle | H05B 45/385 315/291 |
| 2017/0055325 A1* | 2/2017 | Rodinger | H05B 45/37 |
| 2019/0082510 A1* | 3/2019 | Bogart | G05F 1/625 |
| 2019/0182922 A1* | 6/2019 | Jain | H05B 45/10 |
| 2020/0112171 A1* | 4/2020 | Bogart | H03K 17/94 |

* cited by examiner

Primary Examiner — Michael C Zarroli

(57) ABSTRACT

A LED bulb contains a dimming circuit, powered and controlled by an ON-OFF light switch. The quickly done, OFF-ON is converted to a DC binary signal for the Microcontroller Embedded Firmware. Then the Bulb is put into Dimming Mode and the Microcontroller Firmware outputs a continuously pulsed signal, to the LED current control IC to set the current. This is duplicated in the Warm White LEDs to vary their brightness. The percentage ON time of the pulse gives the percentage brightness of the LEDs. A variety of dimming and brightening cycles are displayed using Microcontroller Firmware. Then turning OFF the switch will lock in the dim point. It is saved in non-volatile Microcontroller Embedded EEPROM. When OFF then wait more than 2.0 seconds and turn ON and the Bulb and it is in Normal Mode and displays the last saved dim point and operates as a regular LED Bulb.

43 Claims, 12 Drawing Sheets

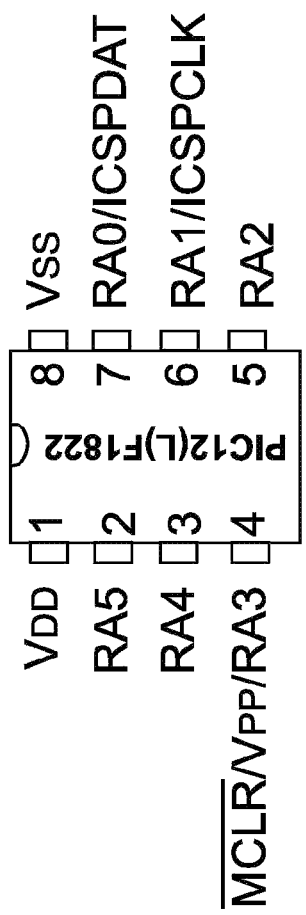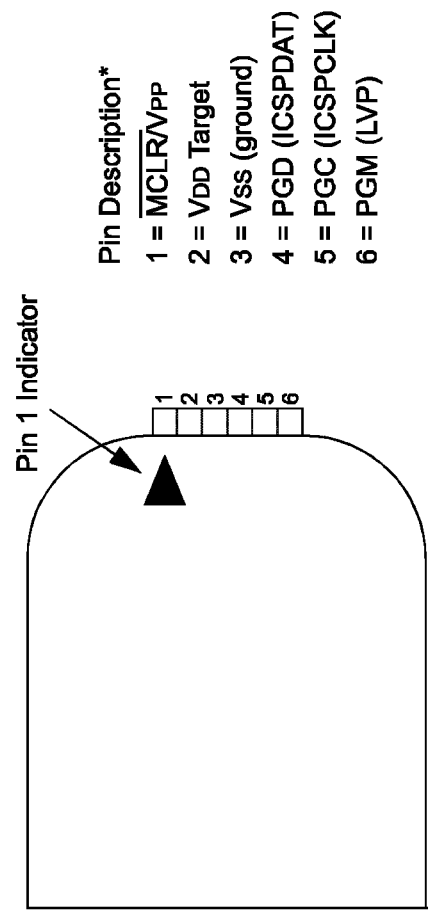
FIG. 8A (PRIOR ART)
FIG. 8B (PRIOR ART)
FIG. 8

LED DIMMER BULB USING MICROCONTROLLER AND AC MAINS TOGGLE SWITCH FOR POWER AND DIM CONTROL

CROSS-REFERENCE TO RELATED APPLICATIONS

The following was filed as a provisional patent using material from myself, Michael Gytis Treciokas, of Ottawa, Ontario, Canada. The provisional patent number is given below along with details.

U.S. 62/727,539 was filed Sep. 5, 2018 and is called LED Dimmer Bulb Using Microcontroller and AC Mains Toggle Switch for Power and Dim Control. This utility patent document is a continuation of this provisional patent.

Also filed was U.S. 62/639,953 on Mar. 7, 2018 and is called LED Dimmer Bulb Using AC Mains Toggle Switch for Power and Dim Control. And U.S. 62/578,480 filed Oct. 29, 2017 and is called LED Dimmer Bulb Using AC Mains Toggle Switch. And U.S. 62/457,993 filed Feb. 12, 2017 and is called LED Dimmer Bulb Using AC Mains Toggle Switch. This utility patent is a continuation in part of the three expired provisional patents listed above. During experimentation, one of these provisional patents replaced the voltage regulator with an AC to 5V USB charger module that was stripped down to fit. This was not continued because it was an OEM module.

All of these provisional patents used the same Microcontroller and employed different dimming methods. The final dimming method, the use of pulses with a Microcontroller was the most recent provisional patent. It was the most efficient and was used as a basis of this utility patent. Pulses from the Microcontroller, controlled by Embedded Firmware, to brighten and dim the warm white LEDs given the ON-OFF light switch switching.

Claims: 22; Independent Claims: 5
Current U.S. Class:
Current CPC Class: H05B 33/0803 (20130101); H05B 33/0851 (20130101);
   H05B 33/0845 (20130101); H05B 33/0815 (20130101); F21V 19/003 (20130101); F21K 9/235 (20160801); F21Y 2115/10 (20160801); Y02B 20/383 (20130101); F21K 9/238 (20160801); F21V 19/006 (20130101); F21K 9/232 (20160801)

| U.S. patent documents | | |
|---|---|---|
| 2010/0148691 | June 2010 | Kuo |
| 2012/0242247 | September 2012 | Hartmann |
| 2013/0038227 | February 2013 | Yan |
| 2015/0022109 | January 2015 | Lee |
| U.S. Pat. No. 9,801,246 B2 | Oct. 24, 2017 | Rodinger |

STATEMENT REGARDING FEDERALLY SPONSORED RESEARCH AND DEVELOPMENT

Not Applicable

REFERENCE TO A SEQUENCY LIST

Not Applicable

BACKGROUND OF THE INVENTION

The light bulb has been improved upon since its conception. Later there were CFL's or compact fluorescent lamp bulbs, then LED bulbs. Then there were LED bulbs that are used with a dimmer light switch on the wall. There have been some patents that use the ON-OFF switch and a special function chip or special function controller. These may not have had a method to save the dimming level after the switch is turned OFF. This invention uses a Microcontroller programmed with Embedded FLASH Firmware to power and control dimming with an ON-OFF light switch and Embedded non-volatile EEPROM. This invention uses a Microcontroller with Embedded Firmware to detect light switch switching patterns and produce dimming patterns, or turn the light from the bulb, completely ON and completely OFF by programmed Embedded Firmware. So, functionality is control by programmed Embedded Firmware of the Microcontroller. The invention has Normal Mode and Dimming Mode. The LED bulb is normally in Normal Mode. Then the LED bulb displays no light when the light switch is OFF. And displays the brightness point or dim point (previous locked in during Dimming Mode) when the light switch is ON. Dimming Mode is entered into by using a light switch to switch OFF-ON within 0.5 seconds This is determined by Microcontroller Embedded Firmware. Once in Dimming Mode, the bulb blinks twice by going to maximum brightness then no light then maximum brightness to show you are in Dimming Mode. Then the bulb begins at full brightness and dims to no light. Or begins at no light and brightens to full brightness. Then with the LED bulb blinking ON twice and one of the two cycles starts the again. Switching OFF locks in the dim point and saves it into Embedded non-volatile EEPROM for normal use in Normal Mode. The locked in dim point will always be used as the level of illumination in Normal Mode. This is by default, which is different compared to other designs. Then wait more than 2.0 seconds for Microcontroller back-up power to discharge, then turn ON the light switch and the dim point will be displayed in Normal Mode.

Most of the circuitry used is from the datasheets of the components used and is how the manufacturer wants the Engineer to use the device which is next to public domain. The LED Current Driver IC (CL1570) circuit was changed. The pulsed, Microcontroller output goes to a transistor to create pulsed current. This goes to the LED current IC to set the current. This current is duplicated in the LED chain without blinking.

BRIEF SUMMARY OF THE INVENTION

The invention generally relates to a LED dimmer bulb using an AC mains toggle switch for power and dim control, which includes an AC to DC converter, a supply voltage regulator, an adjustable LED current control circuit, a Microcontroller, transistor driver circuit, a LED array and a programming connector for prototyping. The LED bulb is screwed into a standard light socket that is controlled by an ON-OFF light switch. The wording "AC mains toggle switch" can be replaced with "ON-OFF light switch" and means the same thing. Or "an open circuit for AC which is OFF and a closed circuit for AC which is ON".

There has thus been outlined, rather broadly, some of the features of the invention, in order that the detailed description thereof may be better understood, and in order that the present contribution to the art may be better appreciated. There are additional features of the invention that will be described hereinafter.

In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

The Object is to provide a LED dimmer bulb using a Microcontroller and ON-OFF light switch:

To power and control the LED light bulb.

For dimming control with any toggle AC mains light switch, not a dimmer light switch.

That provides a LED bulb with a dimmer inside, so any toggle AC mains light switch, with a light socket can be used.

That uses 120V, 60 Hz to operate. AC mains is used for both power and control signals.

That uses a Microcontroller pulsed signal to turn current ON and OFF to power and dim the LEDs.

This is accomplished by sending the pulses to a transistor driver, which sets current to an adjustable LED current control circuit which is duplicated in the LED chain. The more ON time the brighter the LEDs. There are different dimming patterns available for the light bulb in Dimming Mode.

Other objects and advantages of the present invention will become obvious to the reader and it is intended that these objects and advantages are within the scope of the present invention. To the accomplishment of the above and related objects, this invention may be embodied in the form illustrated in the accompanying drawings, attention being called to the fact, however, that the drawings are illustrative only, and that changes may be made in the specific construction illustrated and described within the scope of this application.

Abbreviations Used

AC—alternating current
LED—light emitting diode
Hz—hertz is cycles per second
DC—direct current
E26—North American light bulb screw
$V_{RMS}$—root mean square, is the equivalent DC voltage that heat's a resistor the same
120V—is 120 VRMs and also called 115V, the AC mains voltage being used
VAC—fuses use this AC voltage designation, but could be replaced with $V_{RMS}$
VDC—direct current voltage
BJT—bipolar junction transistor
NPN—n—type, p—type, n—type silicon transistor
MCLR'—is (MCLR) not or MCLR with a bar on top, if MCLR=1 then MCLR'=0
ON—the light switch is turned on or the high part of the pulse
OFF—the light switch is turned off or the low part of the pulse
IC—integrated circuit or chip
GND—ground voltage
PCB—printed circuit board
EEPROM—Electrically Erasable Programable Read-Only Memory, write to during program
FLASH—retains data in absence of power, write to it when loading program
mA—1 mA=0.001A A is an amp or ampere which is the metric way of measuring current
Ω—the symbol for metric resistance V=IR, 1V=1A×1Ω
mV—1 mV=0.001V V is a Volt which is the metric symbol for voltage

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein:

FIG. 8 is a circuit pinout representing the Microcontroller IC and how to use the Embedded Firmware programmer from the datasheets. (Prior Art)

DETAILED DESCRIPTION OF THE INVENTION

Figure 1:
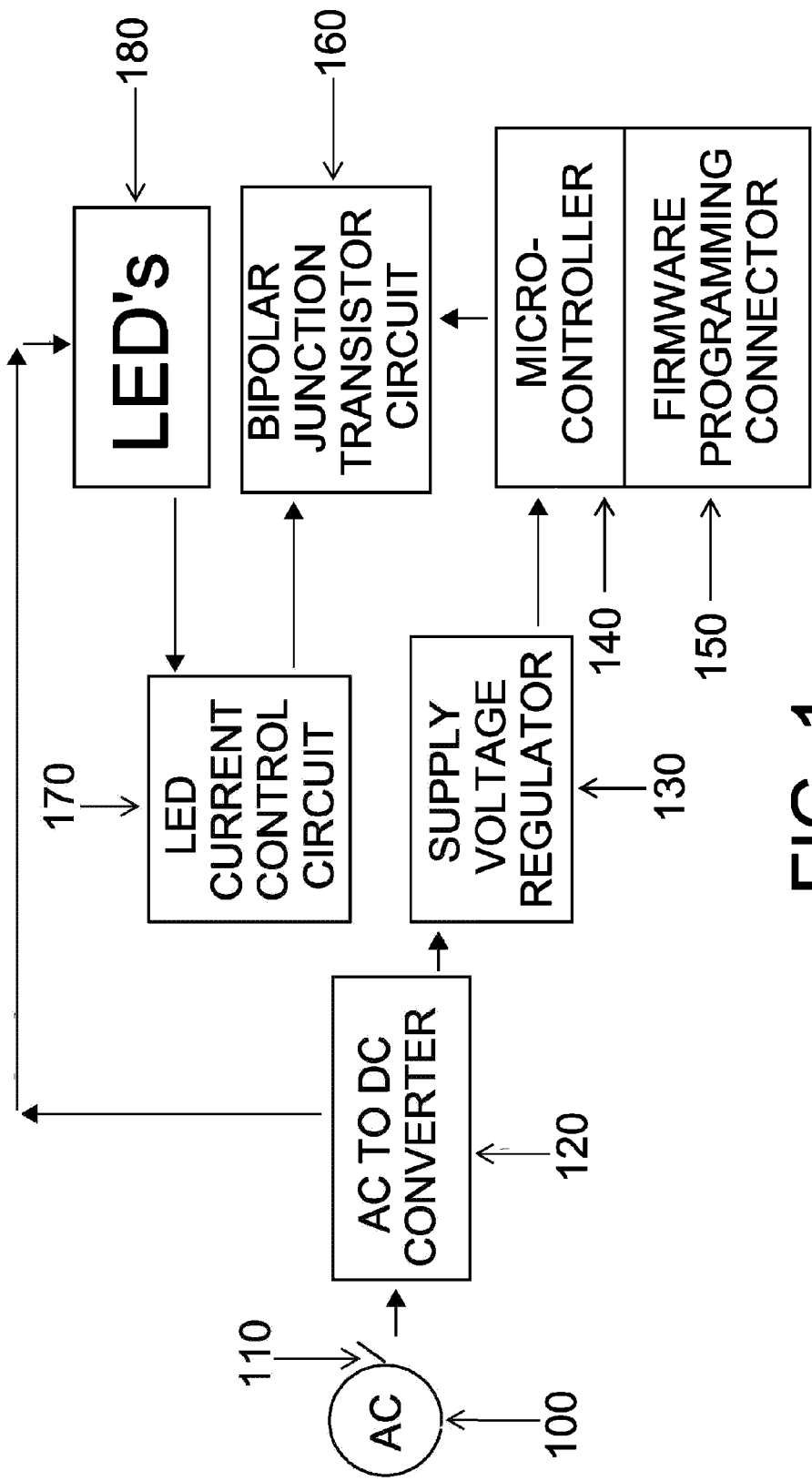
FIG. 1 is a block diagram representing the complete system.

Overview, FIG. 1

Turning now descriptively to the drawings, in which similar reference characters denote similar elements throughout the several views, the figures illustrate an AC to DC converter, a supply voltage regulator, an adjustable LED current control circuit, a transistor circuit, a Microcontroller, a LED array and a programming connector for prototyping. The LED bulb is screwed into a standard light socket that is controlled by an AC toggle light switch. For the schematics pin numbers are included that can be associated with the printed circuit boards.

A LED bulb lighting device contains a dimming circuit and is powered and controlled by an ON-OFF toggle AC mains light switch. (120V, 60 Hz) the quickly done (within 0.5 seconds), OFF-ON switch signal pattern is converted to a DC control signal for the Microcontroller. Once detected, this triggers the Microcontroller Embedded Firmware to pulse and switch the BJT transistor circuit, to vary ON time. Which when ON maximum current is sent to the LED current control circuit. This current through the transistor is duplicated in the warm white LEDs. The pulsed output current to the LEDs vary their brightness in Dimming Mode. The frequency of pulses is so high that flickering is not present in the LED bulb. The more ON time, the brighter the LED bulb. Percentage ON time of the pulse gives percentage brightness. Zero percent is no light and 100% if full brightness. Then turning the light switch OFF will lock in the dim point for then on. And this dim point will be displayed in Normal Mode. Then wait more than 2.0 seconds for Microcontroller back-up power to discharge, then turn ON the light switch and the dim point will be displayed in Normal Mode. To reset the light, quickly turn it OFF-ON within 0.5 seconds, to put it into Dimming Mode again. This will be referenced in fuller detail in FIG. 11.

FIG. 1 shows the LED bulb system. AC 100 provides AC mains output. This is 120V, 60 Hz. The ON-OFF light switch 110 powers and controls the bulb. The AC to DC converter 120 takes the AC mains power and produce a 165 VDC output, with a slight ripple. The converter output voltage provides the maximum LED current. The LED current control circuit 170 is for dimming the LEDs using pulses, at maximum current of 40 mA for brightest and at minimum current of 0 mA for dimmest. Longer ON pulses are used which increases the brightness. The supply voltage regulator circuit 130 takes the output of the AC to DC converter and uses two high wattage resistors to reduce the voltage to the regulator. Voltage regulator programming resistors produces the 5V supply, for the Microcontroller and programming connector. The supply voltage regulator powers the Microcontroller. The Microcontroller 140 has a diode capacitor sub-circuit that charges for power ON. For power OFF, the diode traps the current, so the large capacitor supplies voltage, solely to the Microcontroller. This allows the Microcontroller to read the control signals OFF-ON, being GND-5V, even when AC power is OFF. Once the control signal pattern is read, the LED bulb goes into Dimming Mode and the Microcontroller's pulses and transistor driver starts switching. The transistor driver 160 receives the signal pulses from the Microcontroller which switches the output of the BJT from saturation to cut-off (or short circuit to open circuit). And switches its current between full ON and full OFF for the LED current control circuit. 170 The Switching ON and OFF the current, is duplicated in the warm white LED chain. The Microcontroller gradually increasing the ON time of its pulse from 0% to 100% increases the average current from 0% to 100%. The LED array 180 is in a single chain and it dims or brightens based on the ON time, to the LED current control circuit. The percentage pulse ON time gives the percentage brightness. Turning the light switch OFF saves the dim point in Microcontroller Embedded EEPROM. Then wait more than 2.0 seconds for Microcontroller back-up power (diode capacitor sub-circuit) to discharge, then turn ON the light switch and the dim point will be displayed in Normal Mode. The Microcontroller Firmware Connector 150 allows reprogramming of the Firmware during experimentation. Reprogramming of dimming pattern can also be done.

Figure 2:
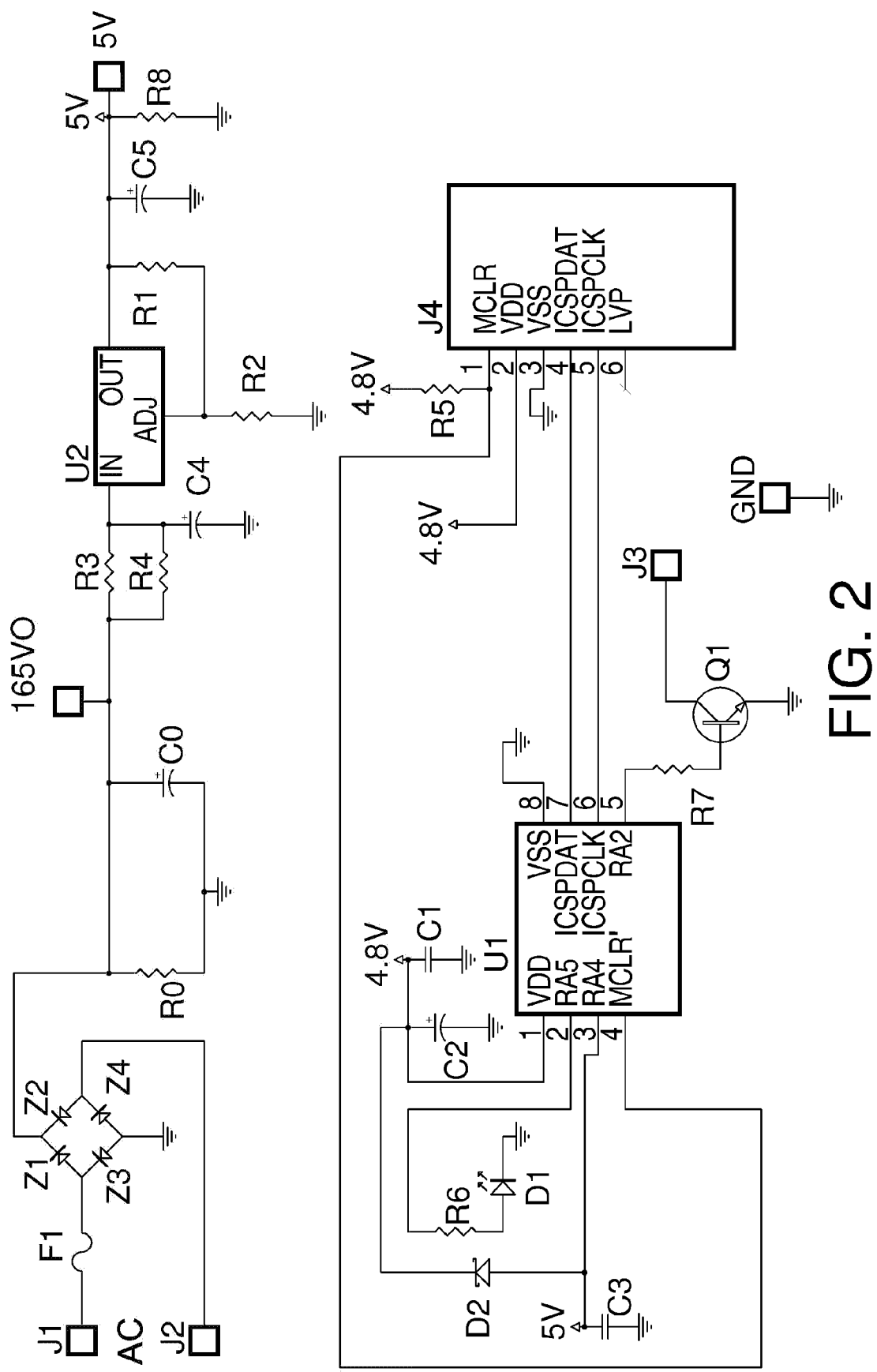
FIG. 2 is a circuit diagram representing the AC to DC converter circuit, supply voltage regulator circuit, Microcontroller circuit, transistor circuit and programming connector circuit.

AC to DC Converter Circuit, FIG. 2

The AC to DC converter, FIG. 2, converts the AC mains from the light socket to a high DC voltage of about 165 VDC with a slight voltage ripple that the supply voltage regulator can use and the LED chain can use. For this embodiment, of the AC to DC converter, J1 and J2 are the bulb screw, F1 is a fuse, Z1, Z2, Z3 and Z4 is a bridge rectifier, C0 is an anti-ripple capacitor. Also, R0 is a current drawing resistor. The AC mains input is 120V, 60 Hz and the bulb screw would be E26, not shown.

In this embodiment, J1 and J2 connect to the AC mains when the light switch is turned on. J1 is hot J2 is neutral. The fuse F1 is for safety and will power down the bulb if there is a short. C0 is used to reduce the ripple from the bridge rectifier. The current drawing resistor R0 is between 165 VDC and ground. It draws a very small amount of current to help C0 reduce the ripple further. At powered down (turning light switch OFF) the current, from the anti-ripple capacitor C0 goes through the resistor R0 to discharge the capacitor, to ground quickly. This helps the Microcontroller read the light switch being turned OFF sooner.

The Supply Voltage Regulator Circuit, FIG. 2

The supply voltage regulator circuit, FIG. 2, U2 takes the bridge rectifier, 165 VDC output voltage and drops it down to a DC supply voltage, for the Microcontroller and programming connector. For this embodiment of the supply regulator circuit, U2 is the regulator and R1, R2 are the supply voltage programming resistors that set the output voltage of 5 VDC. R3, R4 are the voltage drop resistors. C4 is an input capacitor. It also has C5, an anti-ripple capacitor and R8 a current draining resistor for the 5V supply voltage.

For this embodiment, the supply voltage regulator circuit uses R3, R4 to drop down the voltage of about 165 VDC to about 90 VDC. R3 and R4 also dissipates the heat produced by the 40 mA current and 75-volt voltage drop. The remaining voltage is dropped down by the adjustable voltage regulator U2.

Figure 7:
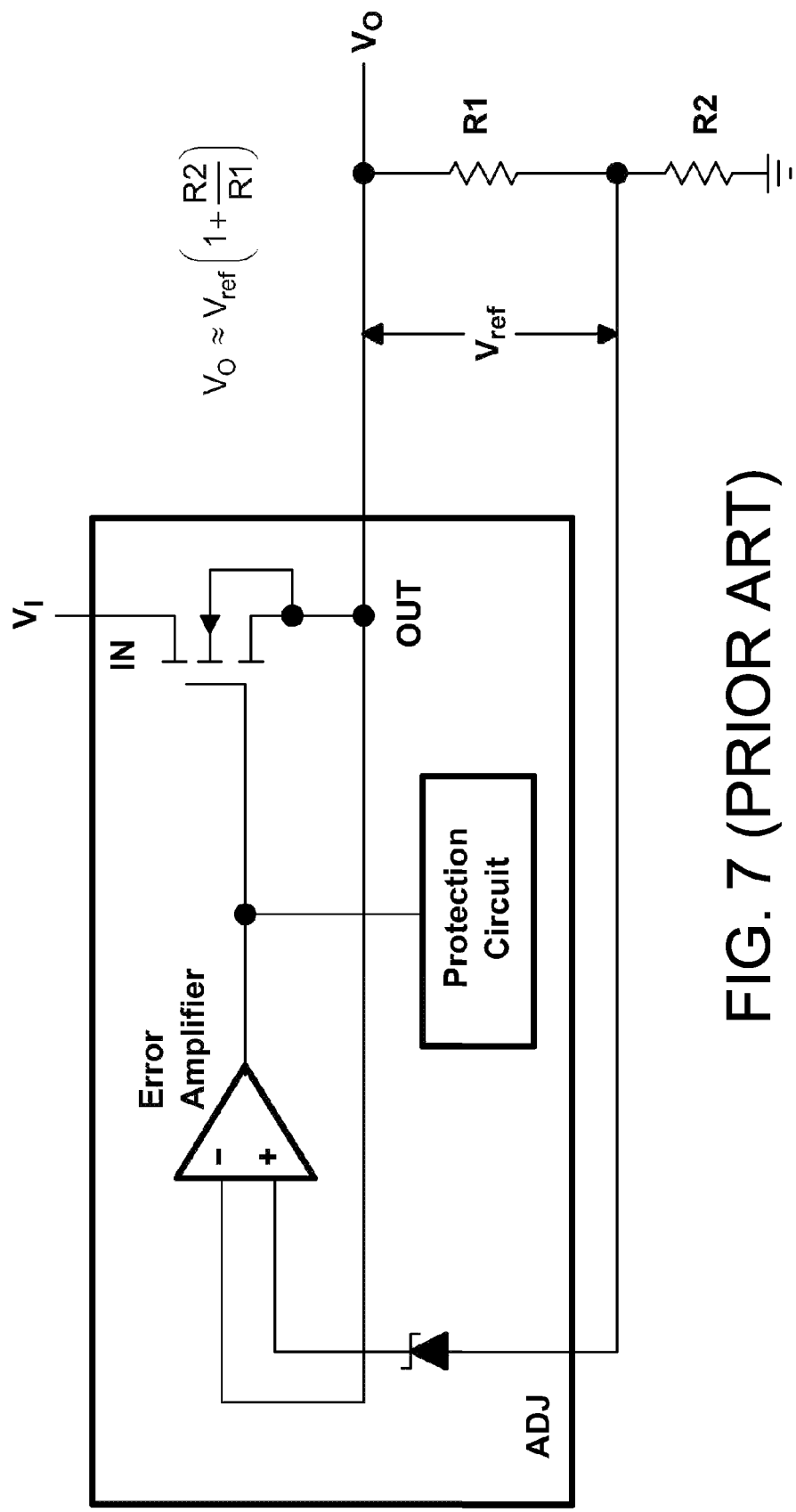
FIG. 7 is a circuit diagram representing the voltage regulator used and the supply voltage setting equation, from the datasheet. (Prior Art)

In FIG. 7 the equation from the datasheet SLVS036N page 1 is given as Equation 1. Equation 2 is also from the datasheet page 13 and gives a more precise answer. With $V_{OUT}$=5V, the calculation yields R1 and R2, both at a tolerance of 1%.

$$V_O \approx V_{ref} \times (1+R2/R1) \quad (1)$$

$$V_{OUT}=1.27V \times (1+R2/R1)+I_{ADJ} \times R2 \quad I_{ADJ}=83 \text{ µA} \quad (2)$$

C4 is an anti-ripple capacitor at the input to reduce ripple at the input of the voltage regulator. C5 is an anti-ripple capacitor at the output to calm the supply voltage. R8 allows the 5V supply and everything connected to it to quickly discharge when the bulb is turned OFF so the Microcontroller can detect the light switch going OFF more quickly.

The Microcontroller Circuit, FIG. 2

FIG. 2, U1, the Microcontroller port, pin 3, RA4 receives the control signals, ground-supply, from the voltage regulator, corresponding to the OFF-ON pattern, of the light switch, within 0.5 seconds, to put it into Dimming Mode. And through Embedded Firmware uses output pulses to control the brightness of the warm white LED chain. By the pulses going through the BJT to produce current to the LED current control IC which is duplicated in the LED chain. In this embodiment, the Microcontroller has a timer inside to vary the ON time of a rectangular pulsed wave, D2, C2 are for power backup, D1, R6 are a LED indicator. Also, C1, C3 are decoupling capacitors, J4 is a programming connector.

In this embodiment, a diode-capacitor circuit (D2, C2) was used to keep just the Microcontroller powered, when the light switch is turned OFF. When the switch is ON, 5V goes through the diode D2, in the direction of the arrow. It causes a very small drop of 0.2V. The other side of D2 charges up a large electrolytic capacitor, C2. When the light is turned OFF, current cannot go in the other direction through D2. So C2 supplies voltage to the Microcontroller's $V_{DD}$ pin on, power OFF.

The current drawing resistor, R8, is now on the supply voltage schematic, FIG. 2, between 5V and ground. It is used, so that when the light switch is turned OFF, the 5V goes through R8, to quickly reduce the supply voltage, to ground and discharges C5 quickly. This is also a control signal, to the Microcontroller port to detect OFF, while D2 and C2 keep the Microcontroller powered to record power OFF state.

The output of U1 is a pulsed signal on pin 5, RA2. The frequency of that point is 1.98 kHz. High enough to prevent flicker of the warm white LEDs. This goes through a resistor R7 to the base of a BJT, Q1. Setting R7, so when U1, RA2, pin 5 is at 4.8V, the current through R7 is not too high, but will drive the BJT transistor into saturation (short circuit with a 0.125V drop). The emitter of this NPN transistor is grounded, so when the Microcontroller's pulsed signal RA2 is ground, Q1 will go into cutoff (open circuit). The BJT produces current in the LED current control IC that is duplicated in the LED chain. The ON-time pulse starts as high only, then reduces through to 80% through 60% continuing down 20% then low only. This dims the bulb. When the bulb is turned OFF the ON-time of the pulse is saved to Microcontroller non-volatile Embedded EEPROM memory for future use, as the last saved dim point. Then wait more than 2.0 seconds for Microcontroller back-up power (D2, C2) to discharge, then turn ON the light switch and the dim point will be displayed in Normal Mode. The saved dim point is used on power up in Normal Mode.

Similarly the on-time pulse starts as low only, then increases thorough to 20% thorough 40% continuing up through 60% then only high. This brightens the bulb. When the bulb is turned OFF the ON-time of the pulse is saved to Microcontroller non-volatile Embedded EEPROM memory for future use, as the last saved dim point. Then wait more than 2.0 seconds for Microcontroller back-up power (D2, C2) to discharge, then turn ON the light switch and the dim point will be displayed in Normal Mode. The saved dim point is used on power up in Normal mode.

The Embedded Firmware programming connector J4, for the Microcontroller is soldered on the PCB, for development of the invention. But can be removed once development is complete. Then a dip socket for U1 on the PCB can be used to insert a preprogrammed Microcontroller, in its place.

The Microcontroller Embedded Firmware is FLASH. Interconnection Between Schematic Figures FIG. 2, FIG. 3, FIG. 4, FIG. 5

Figure 3:
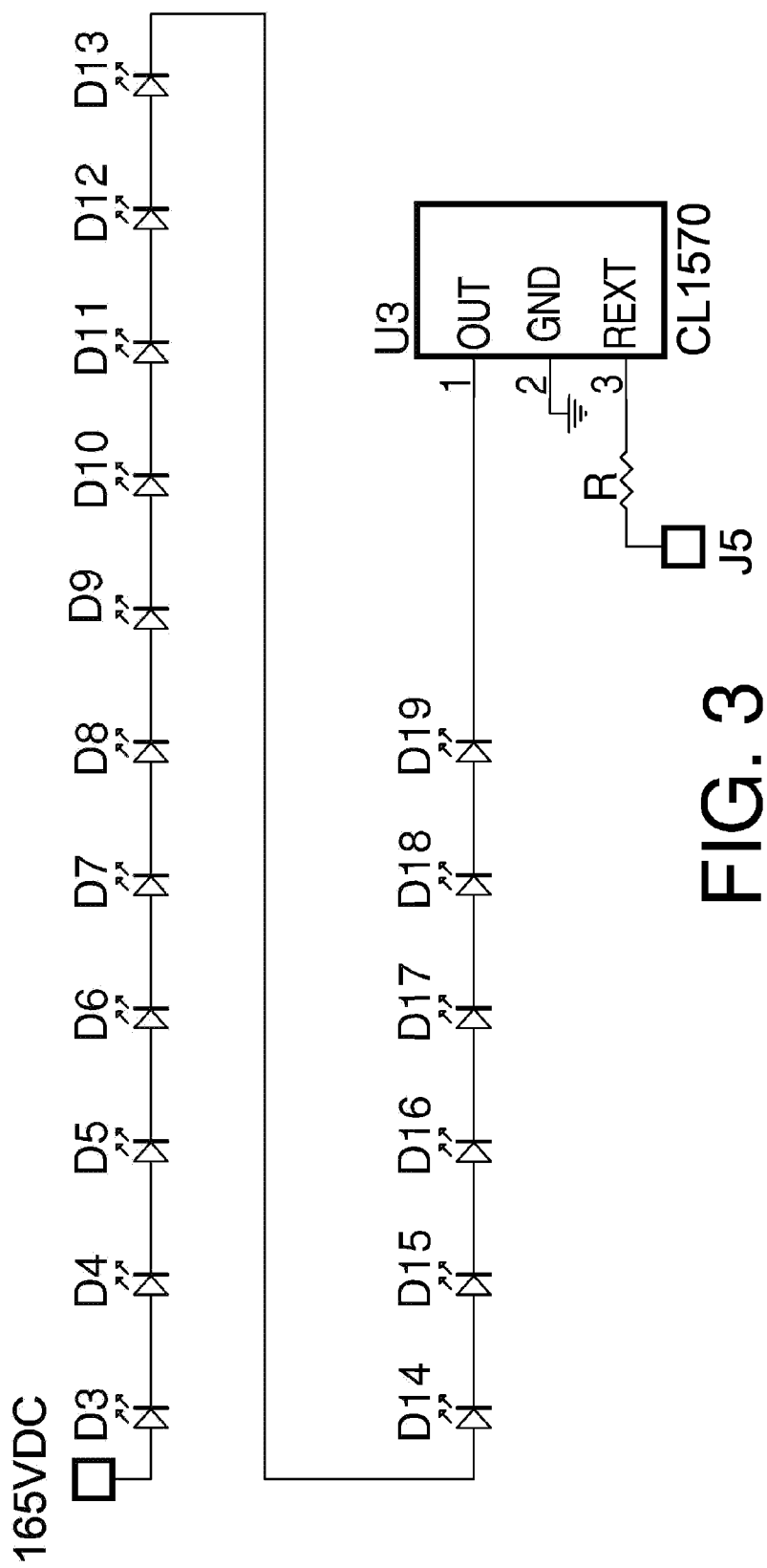
FIG. 3 is a circuit diagram representing the warm white LEDs and LED current control IC with current setting resistor.
Figure 4:
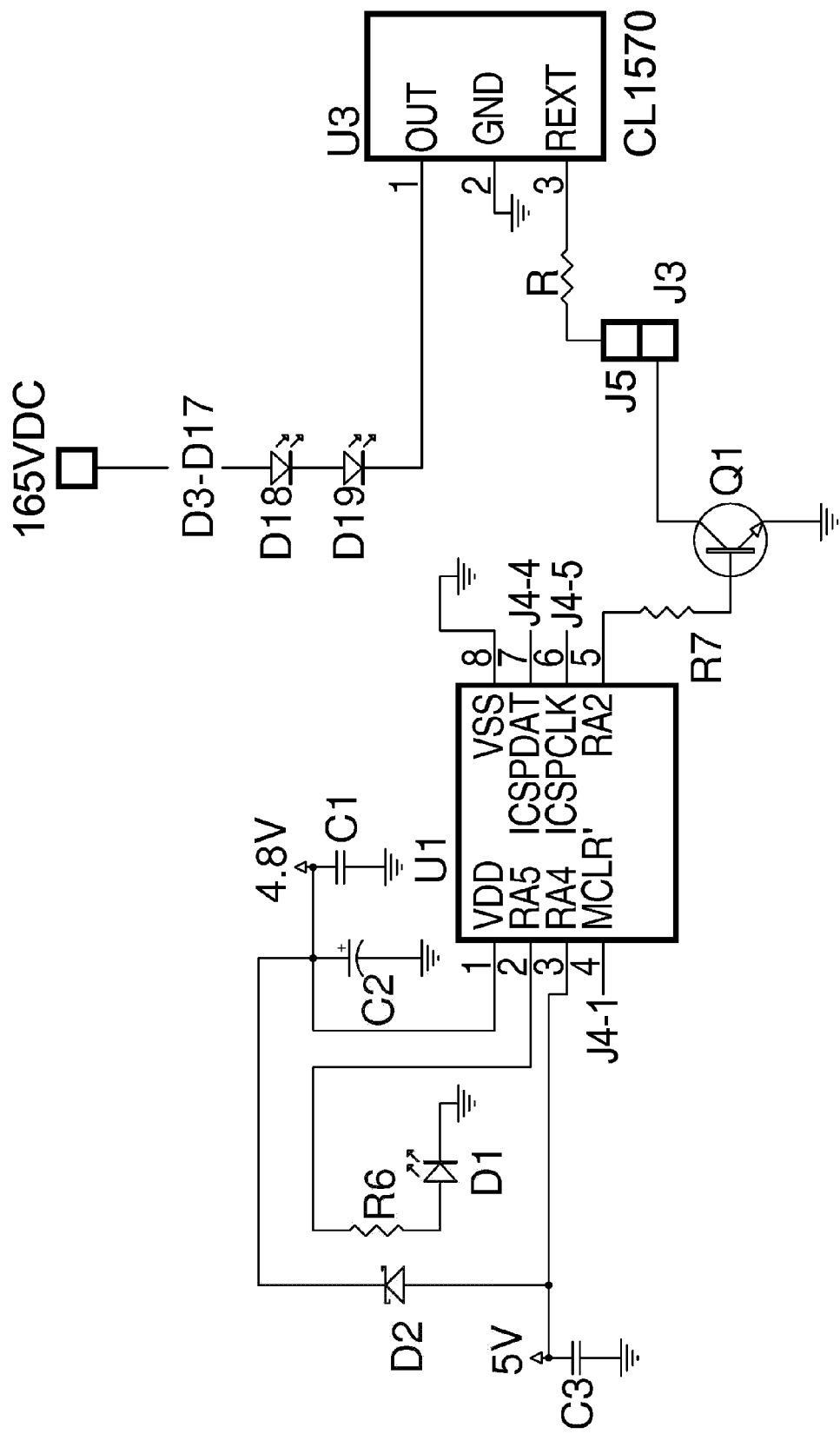
FIG. 4 is a circuit diagram representing the Microcontroller circuit, connected to the BJT transistor circuit connected to the LED current control IC that is connected to D3-D19 powered by 165 VDC.
Figure 5:
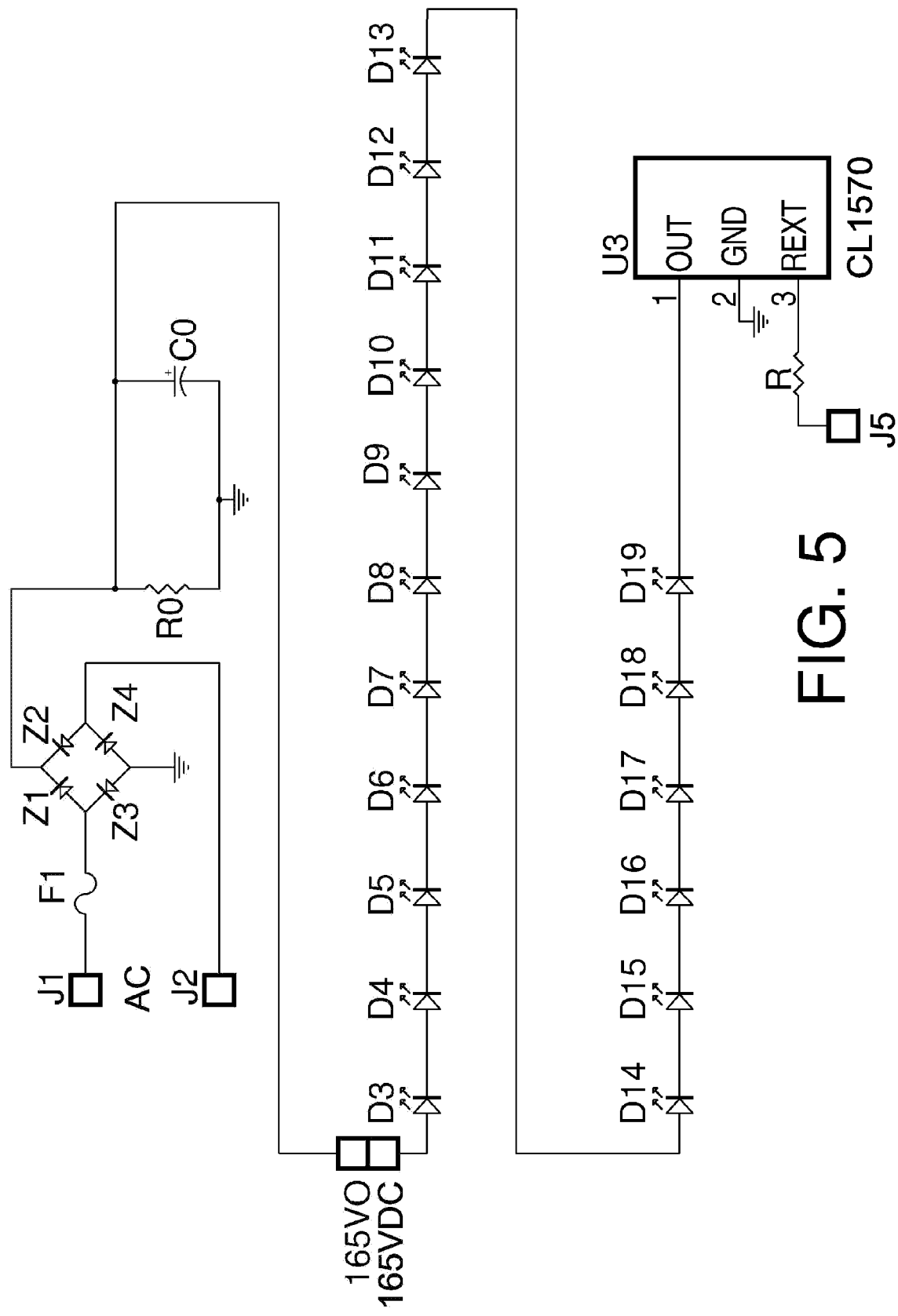
FIG. 5 is a circuit diagram representing the AC to DC converter circuit powering the warm white LED chain connected to the LED current control IC and a current setting resistor that duplicates the current in the LED chain.

The schematic figures, FIG. 2 J3 and FIG. 3 J5 are interconnected and are shown in FIG. 4. FIG. 2, 165 VO and FIG. 3, 165 VDC are interconnected which is shown in FIG. 5. FIG. 4, J4-1, J4-4 and J4-5 are connected to FIG. 2, J4 pins, 1, 4 and 5 respectively.

The LED Current Control IC Circuit, FIG. 3, FIG. 4, FIG. 5

In FIG. 3, U3, the adjustable LED current control IC provides current to the warm white LED chain, D3-D19. In FIG. 5, 165 VDC on the 165 VO point from the AC to DC converter powers the LEDs. In FIG. 4, the current for the LED chain is set by the current through the R and the transistor Q1. The voltage across the transistor when it is in saturation or ON is $V_{CE(SAT)}$. For this embodiment the LED current control IC FIG. 4, U3, is IC CL1570. This uses pin 3, REXT connected to R and then to Q1's collector, then the emitter to ground. This is $V_{TOT}$ (REXT to ground) where the typical value is 0.4V. For our embodiment $V_{CE(SAT)}$=125 mV, $I_{LED}$=40 mA.

Where IR is the current going through the resistor R. U3 produces the same current going through the warm white LEDs, $I_{LED}$. Where R=V/I.

$$R_{TOT}=R+R_{VCE(SAT)} \quad (3)$$

$$R=V/I \quad (4)$$

$$V_{TOT}/I_R=R+(V_{CE(SAT)}/I_R) \quad (5)$$

$$R=V_{TOT}/I_R-V_{CE(SAT)}/I_R \quad (6)$$

$$R1=(V_{TOT}-V_{CE(SAT)})/IR \quad (7)$$

$$\text{where } I_{LED}=I_R \quad (8)$$

Equations 3-8 derive the formula to be used. Equation 7 and 8 were used and a 4.7Ω resistor was put in for R and produced a voltage of 0.3V and gave a current IR of 35 mA. It was determined by experimentation that R=0 Ω gave around $I_{LED}$=40 mA because the voltage at the REXT pin dropped with smaller resistance but zero ohms provided the maximum current.

In FIG. 5, the circuit starts with the output of Z1, Z2, Z3 and Z4 the bridge rectifier of about 165 VDC at the 165 VO pad. It connects to the 165 VDC pad. This goes through D3-D19 that is connected to U3, pin1, OUT. The voltage drop of D3-D19 which is seventeen LEDs is 9.5 VDC per LED at 40 mA. The 165 VDC of the bridge rectifier has a maximum current of 40 mA going through the input of the LED chain. So 165 VDC−(17×9.5 VDC)=3.5 VDC to be dropped by U3 itself. The current selected for these LEDs gives long life and good brightness. One of these LED chips is actually multiple LEDs, in one chip.

In FIG. 4, to vary the current through R=0Ω that goes through the collector of the transistor, Q1, while the emitter is connected to ground is as follows. The current through R, IR, would be maximum when VCE is saturated $V_{(CE)SAT}$. And minimum at VCE is open circuit. The ON time is when the signal from the Microcontroller to R7 is 4.8V and the transistor is in saturation and gives the LEDs at their brightest. The OFF time is when the signal from the Microcontroller to R7 is at ground and the transistor is in cut-off or open circuit. So, the current is zero and the LEDs are dimmest (no light). But because we are using pulses, the ON time and OFF time of current, controls the brightness. The percentage ON time of the pulse gives percentage brightness.

The percentage on-time of the microcontroller pulse is varied linearly for brightening and dimming. Percentage on-time is percentage brightness. Therefore, the brightening and dimming cycles are linear.

Figure 6:
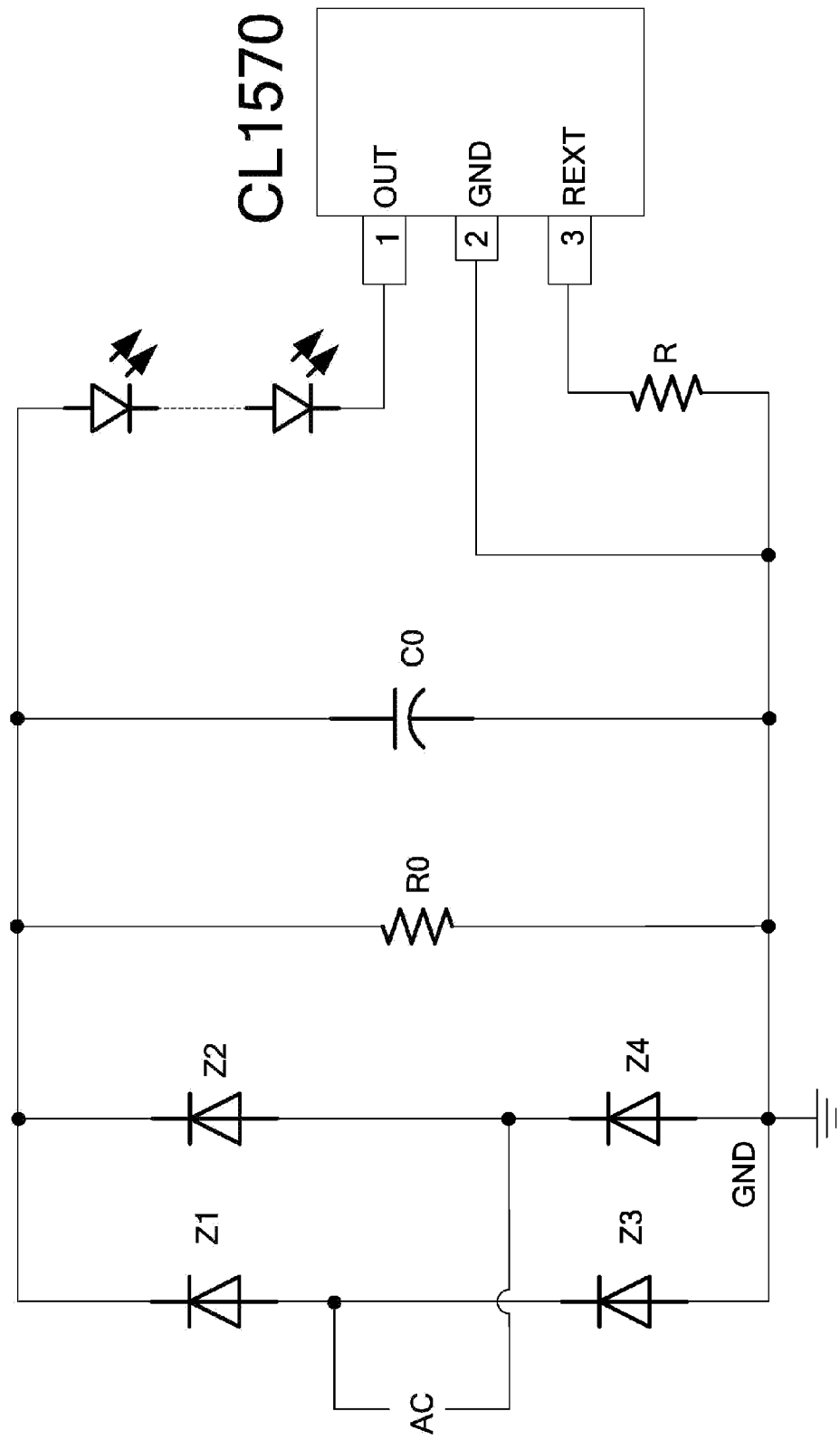
FIG. 6 is a circuit diagram representing the AC to DC converter circuit powering the LED's connected to the LED current IC and a current setting resistor that duplicated the current in the LED chain, from the datasheet. (Prior Art)

Prior Art FIG. 6, FIG. 7 and FIG. 8

The Prior Art in FIG. 6, FIG. 7 and FIG. 8 are from the datasheets for the LED current control IC, the voltage regulator and the Microcontroller respectively. These datasheets show how the manufacturers want you to use their devices and are the next thing to public domain.

The datasheets are as follows:
FIG. 6—ChipLink_Tech, CL1570_CN Rev 1.16, CL1570, LED Current Driver, from page 1.
FIG. 7—Texas Instruments, SLVS036N Rev January 2015, TL783, High-voltage Adjustable Regulator, from page 1.
FIG. 8A—Microchip, DS40001413E, PIC12(L)F1822/16 (L)F1823. Microcontroller, from page 3.

FIG. 8B—Microchip, DS51795B, PICkit3 User's Guide, from page 15

For U3 found in FIG. 3, FIG. 4, FIG. 5 the LED current control IC is given in FIG. 6. Pins 1 to 3 are labelled 1-OUT, 2-GND, 3-REXT. This is given along with the circuit for this embodiment. The LED current control IC with LEDs is shown in the datasheet schematic FIG. 6. In our design FIG. 5 is the same circuit with U3 being the CL1570 and Z1, Z2, Z3, Z4, R0, R and C0 the same as FIG. 6. This prior art schematic is the same as the patent schematic and is how the manufacturer wants the two devices connected so it is next to public domain. In FIG. 6 the type of LED is generic so the number of LEDs is unknown. The number of LEDs used depends on the voltage drop across a single LED chip multiplied by the number of LEDs getting close to 165 VDC but not going over. This keeps the voltage drop across U3 small.

For U2 found in FIG. 2 the voltage regulator IC is given in FIG. 7. No pins numbers are used, but there are three pin labels; IN, OUT and ADJ. An innovative voltage regulator was used that had a high input voltage (120 VDC). We used the datasheet schematic and equation in FIG. 7. This prior art schematic is the same as the patent schematic and is how the manufacturer wants the two devices connected so it is next to public domain. This is used to power the Microcontroller. We tried Zener diodes to drop the voltage from 165 VDC to 90 VDC that goes to the voltage regulator. This did not work so we used resistors R3 and R4 instead.

The voltage regulator U2 in FIG. 2 is the same as FIG. 7. R1 and R2 need to be set for the output voltage to be 5.0 VDC. The equation in FIG. 7 is used and the resistors selected are 1% tolerance. Adding anti-ripple capacitors C4 and C5 to the input and output of U2 is a common accepted practice.

For U1 in FIG. 2 and FIG. 4, the Microcontroller IC is given in FIG. 8A from the datasheet. Pins 1 to 8 are labelled as 1-VDD, 2-RA5, 3-RA4, 4-MCLR'/VPP/RA3, 5-RA2, 6-RA1/ICSPCLK, 7-RA0/ICSPDAT, 8-VSS. For FIG. 8A some pin names have two functions separated by a slash. Only the function being used in the patent is written referenced beside the pin for U1 and is given as italics above.

For J4 in FIG. 2, the programming connector pin out is given in FIG. 8B. Pins 1 to 6 are labelled as 1-MCLR'/VPP, 2-VDD TARGET, 3-VSS (GROUND), 4-PGD (ICSPDAT), 5 PGC (ICSPCLK), 6-PGM (LVP). For FIG. 8B some of the pin descriptions have two functions separated by brackets. Only the function being used in the patent is written referenced beside the pin for J4 and is given as italics above.

The Microcontroller FIG. 2 and FIG. 8A Prior Art are the same. It shows in FIG. 2 the pinout of the IC, U1 the same as FIG. 8A. FIG. 2 programmer pinout J4 is the same as FIG. 8B. For FIG. 8A, RA4 is a binary pin input that detects if the light switch is ON or OFF by seeing if the voltage regulator is powered up or down. RA2 is a pin binary output that sends pulses through a resistor, R7 to a transistor Q1. Then to the LED current control IC, U3 to brighten or dim the LEDs. RA5 is connected to a resistor, R6 and 5 mm LED, D1. When the LED goes on, the bulb is in Dimming Mode. In the diode-capacitor circuit, D2 is connected to 5V and C2 to $V_{DD}$ and $V_{SS}$. The diode drop of 0.2V leaves the voltage across the capacitor and $V_{DD}$ of 4.8V. Current can't go through in the other direction. The capacitor powers the Microcontroller when the light switch is turned OFF. The capacitor and diode keep power local to Microcontroller. Microcontroller Programmer Schematic from Prior Art, FIG. 8, FIG. 9

Figure 9:
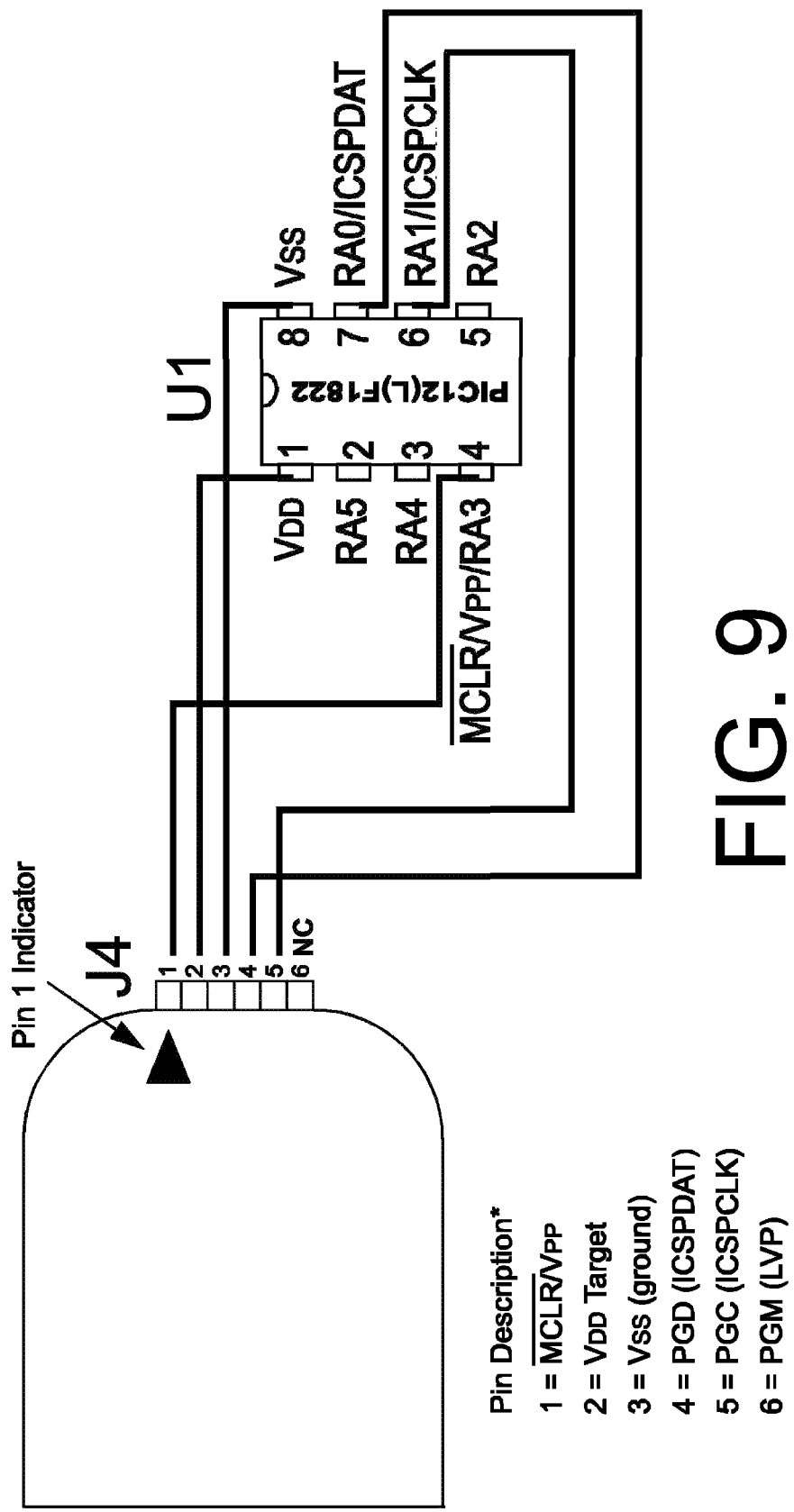
FIG. 9 is a circuit schematic showing the pinout the Microcontroller IC and the Embedded Firmware programmer and how they are connected together.

FIG. 9 show the interconnects between the Microcontroller and programmer given the pinout information in FIG. 8. The single quote is a not negation for MCLR'. Here are the interconnections:

J4-1 MCLR'/Vpp connects to U1-3 MCLR'/Vpp/RA3
J4-2 $V_{DD}$ TARGET connects to U1-1 $V_{DD}$
J4-3 $V_{SS}$ (GROUND) connects to U1-8 $V_{SS}$
J4-4 PGD (ICSPDAT) connects to U1-7 RA0/ICSPDAT
J4-5 PGC (ICSPCLK) connects to U1-6 RA1/ICSPCLK
J4-6 PGM (LVP) is not connected If you compare the FIG. 9 schematic with FIG. 2 looking at the J4 and U1 schematic, they are the same. FIG. 9 shows the Prior Art pinouts of FIG. 8 when connected. This prior art schematic is the same as the patent schematic and is how the manufacturer wants the two devices connected so it is next to public domain. Of course, $V_{DD}$, J4-2 and U1-1 are also connected to $V_{DD}$=4.8V which is the target. And $V_{SS}$, J4-3 and U1-8 are also connected to $V_{SS}$=0V which is ground. These are implied by their naming. The MCLR' also has a pull-up resistor R5 to $V_{DD}$ as given in FIG. 2 and other documentation.

Figure 10:
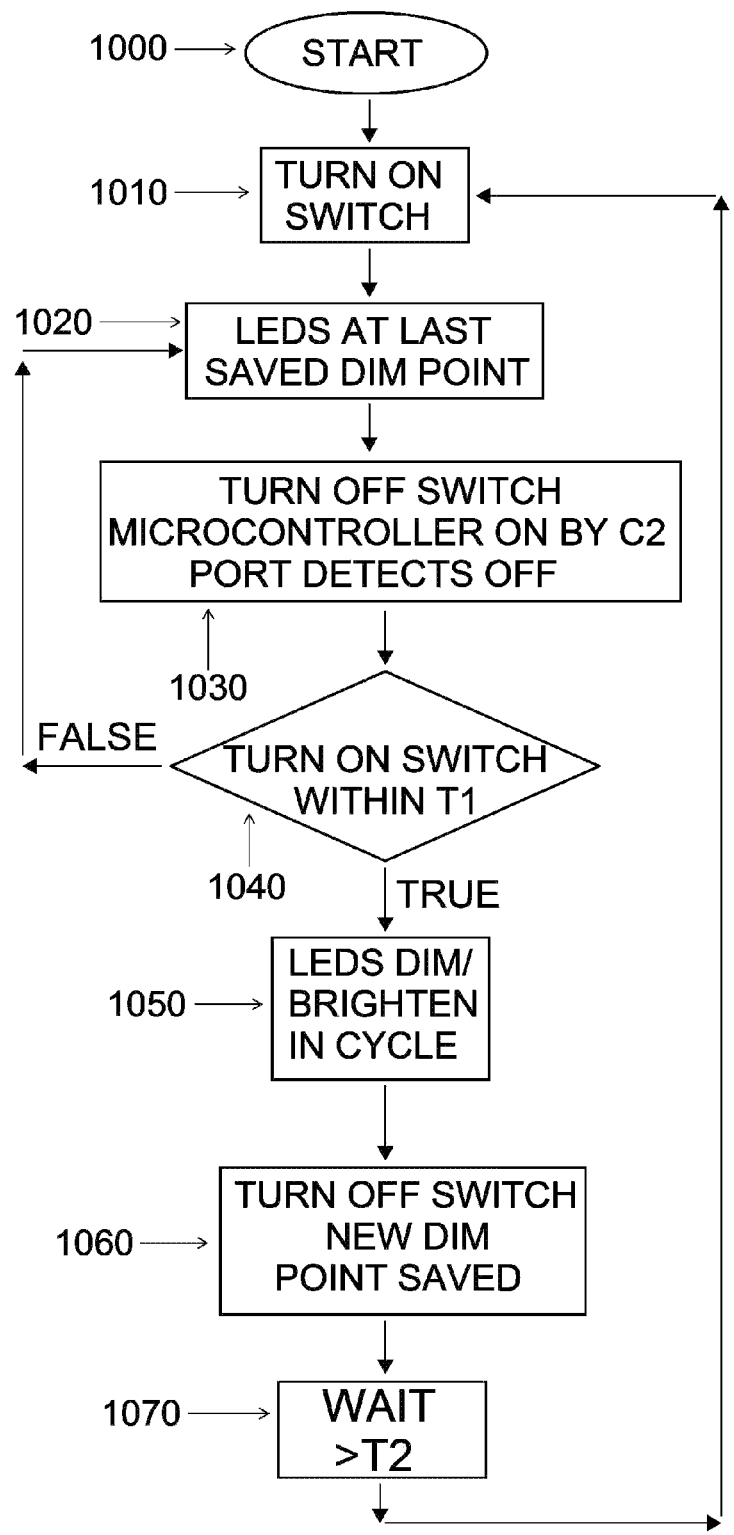
FIG. 10 is an algorithm diagram representing the different states used in operation for Dimming Mode and Normal Mode.

Operation of Preferred Embodiment, FIG. 10

FIG. 10 shows the flowchart logic algorithm, of how the system functions. This is determined by the Microcontroller Embedded Firmware. And is described in the following. T1 is 0.5 seconds. T2 is 2.0 seconds. When the LED bulb has no current flowing through it, the diode capacitor sub-circuit power is held ON for the Microcontroller to save the dim point in its Embedded EEPROM.

In FIG. 10; 1000 the user screws the LED bulb into a standard, Edison screw, light socket that is connected to an AC mains ON-OFF toggle light switch that is already turned OFF.

In FIG. 10; 1010 We start in Normal Mode and the light switch is turned ON and 1020 the light bulb brightness is that of the last saved dim point. 1030 Then the light switch is turned OFF but the Microcontroller is still powered by C2 the large capacitor and it detects the light switch is OFF. 1040 When the OFF period is less than 0.5 seconds before the light switch is turned ON, (true) and the LED bulb is put into Dimming Mode. 1050. If the light switch is turned ON after 2.0 seconds (false) it stays in Normal Mode 1020 and the LEDs remain at the same brightness as last time in Normal Mode. 1050 When in Dimming Mode the LEDs blink ON twice. Then the LEDs display a dimming or brightening cycle. Then they blink ON twice and do another dimming or brightening cycle. A dimming cycle is brightest to no light. A brightening cycle is no light to brightest. 1060 Once the desired brightness is achieved, turn OFF the light switch. 1060. This locks the selected brightness level, or dim point into the Microcontroller's Embedded EEPROM, a non-volatile memory. This takes a little bit of time and C2 again keeps the Microcontroller powered for this. 1070, If the light switch is turned ON after T2=2.0 sec it displays the just saved brightness level or dim point and it is in Normal Mode. 1010 Now you can turn the light switch OFF and ON where the OFF period is greater than 2.0 seconds. This Normal Mode, and the illumination level is at the same brightness as the last saved dim point. To reset the bulb to Dimming Mode go ON then OFF-ON, where the second OFF is less than 0.5 seconds, and repeat above.

The LED's blink ON twice in two seconds. The dimming or brightening cycle takes ten seconds.

Figure 11:
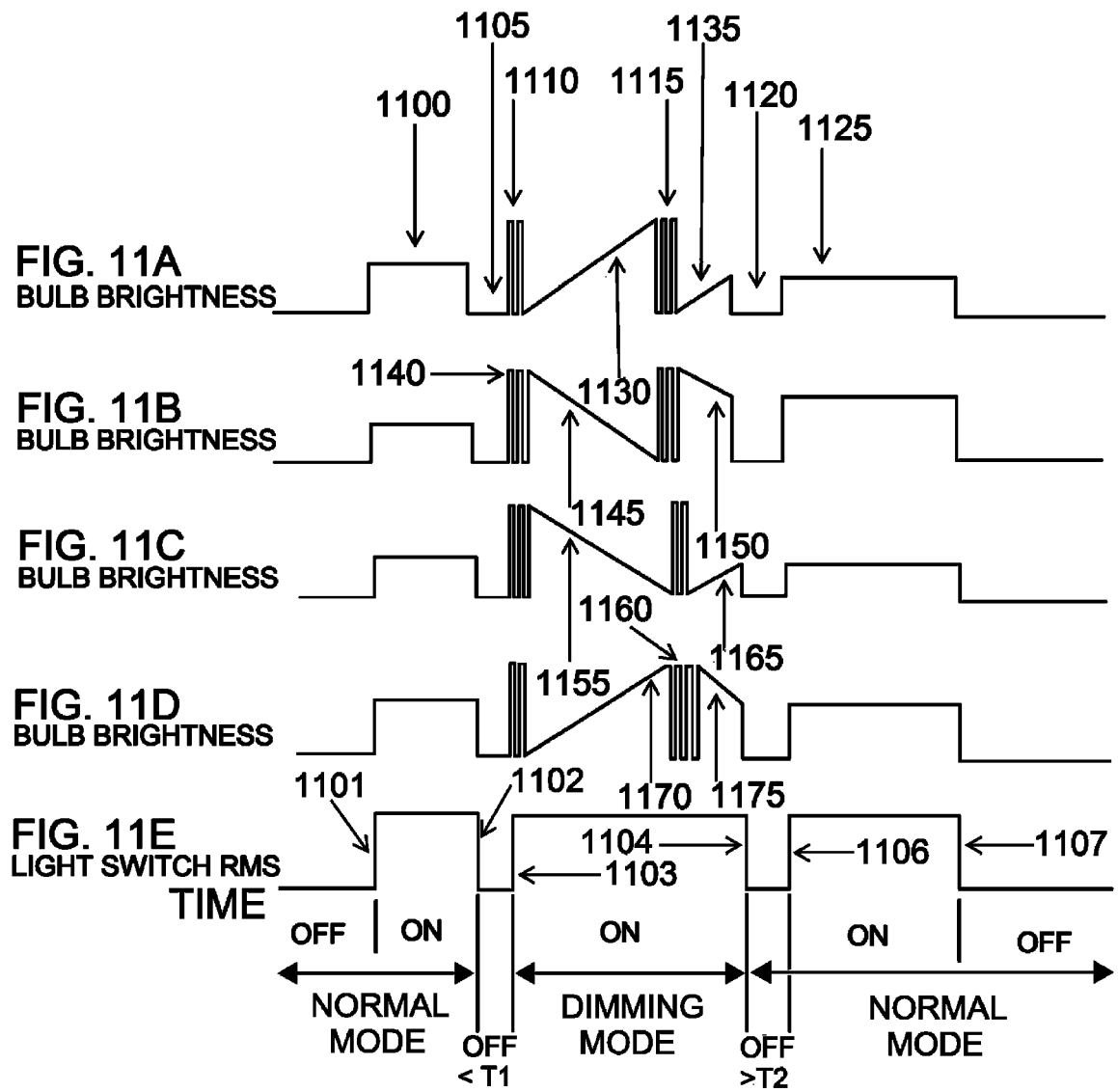
FIG. 11 is a timing diagram of the dimming/brightening cycles given toggling of the light switch of ON and OFF. This is within the context of Normal Mode and Dimming Mode.

Dimming Brightening Cycles FIG. 11

So far in this patent document a simple brightest no light, dim cycle was used in Dimming Mode. However, there are other dim cycles which are covered below. There are several different dimming patterns that can be programmed in. The following are timing diagrams of control signals to the Microcontroller and the associated LED voltage.

So far in this patent document an OFF-ON of the light switch within 0.5 seconds puts the LED bulb into Dimming Mode. At the start of Dimming Mode, the LED bulb blinks twice. Also, the indicator LED FIG. 2, D1 connected to R6 and U1, turns ON to indicate the LED bulb is in Dimming Mode. Then the LED bulb slowly goes from no light to brightest or slowly goes from brightest to no light. For any of the above Dimming Modes, if you do not lock in the dim point for a while, the brightening and/or dimming will repeat in a cycle. All the dimming patterns repeat the designated cycle, so if you miss the dim point the first time, you can select it on the next cycle. To lock in the dim point, turn OFF the light switch. However, there are other dimming and brightening cycles in Dimming Mode that can be programmed in Embedded Firmware of the Microcontroller. FIG. 11 shows different cycles when in Dimming Mode. In simple terms there is brighten-brighten the next is dim-dim the next is dim-brighten and finally brighten-dim. For each one the cycles it repeats. For dim-brighten if switching OFF doesn't happen it will go again dim-brighten. And on and on until the light is switched OFF. Only one of the four are implemented for one bulb. And only one of the four are programmed into Embedded Firmware at one time.

FIG. 11E shows the ON-OFF light switch being turned OFF and ON. OFF is no signal or zero volts. ON is a sine wave of $170V_{PEAK}$ or $120V_{RMS}$ flat level. For FIG. 11E, the LED bulb begins with the light switch in the OFF position. This means for FIG. 11A to FIG. 11D the LED bulb is at no light, for this embodiment T1=0.5 seconds and T2=2.0 seconds. LH or low-high means starts at no light and go to brightest. HL or high-low means start at brightest and dim to no light. The blinking pattern means the bulb is in Dimming Mode.

FIG. 11A This is for the LHLH pattern or low-high, low-high pattern. 1101 Turn the ON-OFF light switch ON and 1100 the light bulb switches ON at the last dim point. 1102 Then turn the light switch OFF and 1105 the LED bulb turns dark. 1103 Then turn the light switch ON in less than T1=0.5 seconds and 1110 the LED bulb starts to blink. The blinking pattern is ON-OFF-ON-OFF. 1130 The LED bulb starts at no light and brightens to maximum brightness. 1115 Then the LED bulb starts to blink indicating a new cycle. The blinking pattern is OFF-ON-OFF-ON-OFF. 1135 The LED bulb starts at no light and brightens. 1104 The ON-OFF light switch is turned OFF and 1120 the light goes OFF and the dim point or brightness is locked in. After the ON-OFF light switch has been OFF greater than T2=2.0 seconds 1106 and it is turned ON, it is in Normal Mode. When the light switch is turned ON 1125 the bulb displays the brightness of the last saved dim point. 1107 When the switch is turned OFF the bulb turns dark.

FIG. 11B this is for the HLHL pattern or high-low, high-low pattern. 1101 Turn the ON-OFF light switch ON and 1100 the light bulb switches ON at the last saved dim point. 1102 Then turn the light switch OFF and 1105 the LED bulb turns dark. 1103 Then turn the light switch ON in less than T1=0.5 seconds and 1140 the LED bulb starts to blink. The blinking pattern is ON-OFF-ON-OFF-ON. 1145 The LED bulb starts at maximum brightness and dims to no light. Then like in 1140 then the LED bulb starts to blink indicating a new cycle. The blinking pattern is ON-OFF-ON-OFF-ON. 1150 The LED bulb starts at maximum brightness and dims. 1104 The ON-OFF light switch is turned OFF and 1120 the light goes OFF and the dim point or brightness is locked in. After the ON-OFF light switch has been OFF greater than T2=2.0 seconds 1106 and it is turned ON, it is in Normal Mode. Then 1125 the bulb displays the brightness of the last saved dim point. 1107 When the switch is turned OFF the bulb turns dark.

FIG. 11C This is for the HLLH pattern or high-low, low-high pattern. 1101 Turn the ON-OFF light switch ON and 1100 the light bulb switches ON at the last saved dim point. 1102 Then turn the light switch OFF and 1105 the LED bulb turns dark. 1103 Then turn the light switch ON in less than T1=0.5 seconds and 1140 the LED bulb starts to blink. The blinking pattern is ON-OFF-ON-OFF-ON. 1155 The LED bulb starts at maximum brightness and dims to no light. Like in 1110 the LED bulb starts to blink indicating a new cycle. The blinking pattern is ON-OFF-ON-OFF. 1165 The LED bulb starts at no light and brightens. 1104 The ON-OFF light switch is turned OFF and 1120 the light goes OFF and the dim point or brightness is locked in. After the ON-OFF light switch has been OFF greater than T2=2.0 seconds 1006 and it is turned ON, it is in Normal Mode. Then 1125 the bulb displays the brightness of the last saved dim point. 1107 When the switch is turned OFF the bulb turns dark.

FIG. 11D this is for the LHHL pattern or low-high, high-low pattern. 1101 Turn the ON-OFF 1100 light switch ON and the light bulb switches ON at the last saved dim point. 1102 Then turn the light switch OFF and 1105 the LED bulb turns dark. 1103 Then turn the light switch ON in less than T1=0.5 seconds and 1110 the LED bulb starts to blink. The blinking pattern is ON-OFF-ON-OFF. 1170 The LED bulb starts at no light and brightens to maximum brightness. 1160 Then the LED bulb starts to blink indicating a new cycle. The blinking pattern is OFF-ON-OFF-ON-OFF-ON. 1175 The LED bulb starts at maximum brightness and dims. 1104 The ON-OFF light switch is turned OFF 1120 and the light goes OFF and the dim point or brightness is locked in. After the ON-OFF light switch has been OFF greater than T2=2.0 seconds 1106 and it is turned ON, it is in Normal Mode. Then 1125 the bulb displays the brightness of the last saved dim point. 1107 When the switch is turned OFF the bulb turns dark.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention in which all terms are meant in their broadest, reasonable sense unless otherwise indicated. Any headings utilized within the description are for convenience only and have no legal or limiting effect.

INDEX OF ELEMENTS

10: AC To DC Converter Circuit, FIG. 2
11: J1, J2 The Bulb Screw
12: F1 The Fuse
13: Z1, Z2, Z3 and Z4 The Bridge Rectifier Diodes
14: C0 The Anti-ripple Capacitor
15: R0 The Current Drawing Resistor on Power Down
20: The Supply Voltage Regulator Circuit, FIG. 2
21: U2 The Supply Voltage Regulator
22: R1, R2 The Programming Resistors
23: R3, R4 Resistor Drop Voltage by 100V
24: C4 Supply Input Capacitor
25: R8 Power Down Grounding-Draining Resistor for 5V
26: C5 Supply Output Capacitor for Anti-Ripple 30: The Microcontroller Circuit, FIG. 2
31: U1 The Microcontroller
32: D2, C2 for Power Backup
33: D1, R6 The LED Indicator
34: C1, C3 Decoupling Capacitors
35 J4 A Programming Connector
36 R5 Pull up Resistor for Programming Connector
40: The Bipolar Transistor Circuit, FIG. 4
41: Q1 BJT Transistor
42: R Collector Resistor
43: R7 Base Resistor
50: Adjustable LED Current Control Circuit with Warm White LEDs, FIG. 3
51: U3 Adjustable LED Current IC
53: D3-D19 17 Warm White LED Representation of the LED Bulb Prototype Mechanicals Compared to USPTO Classifications, FIG. 12

Figure 12:
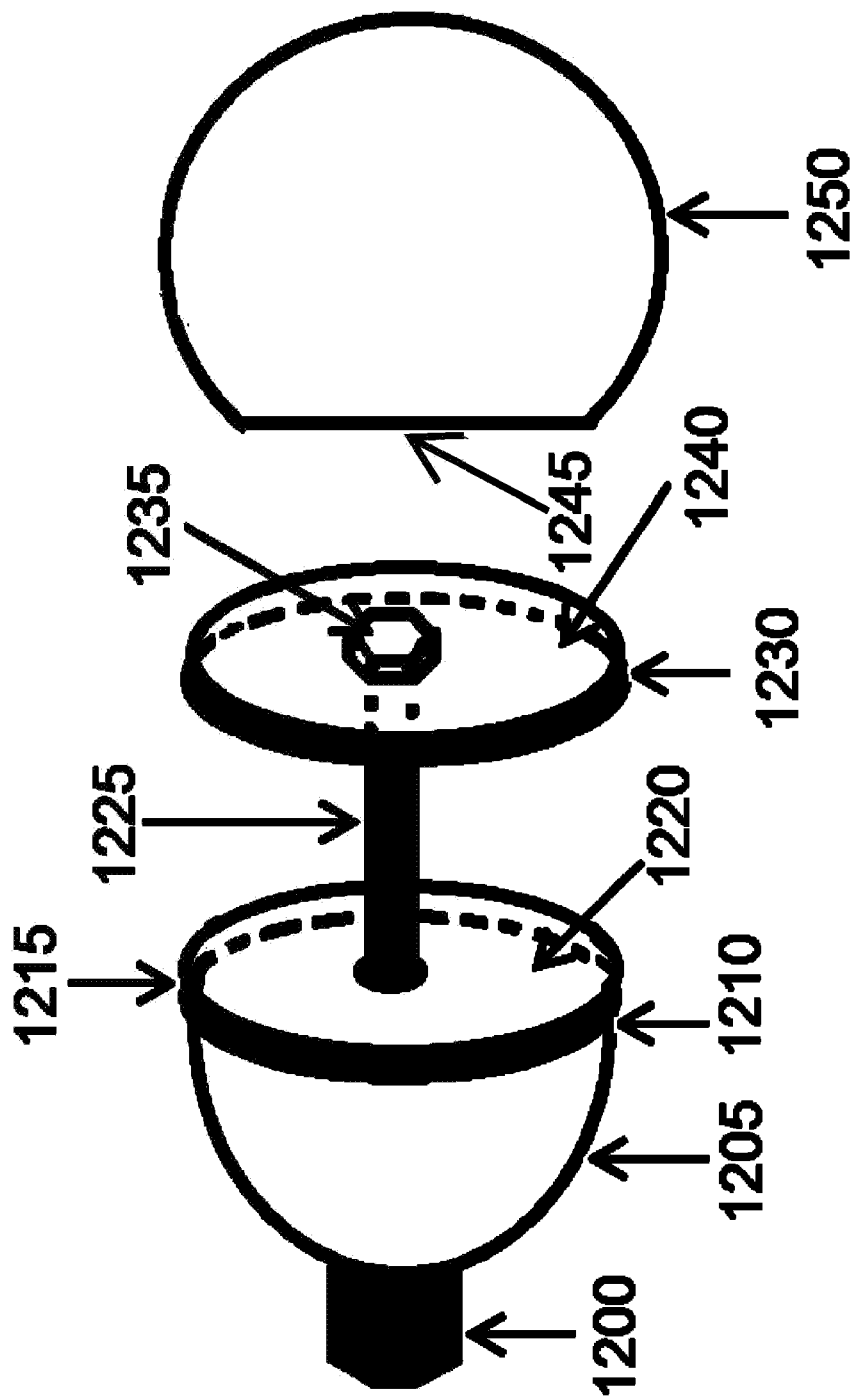
FIG. 12 is a mechanical representation of the LED bulb (not to scale or proportion).

The representation of the mechanicals of the LED bulb in FIG. 12 are not to scale or proportion. They consist of the base with Edison screw, the main PCB and the LED PCB, both with components on, the bolt with nuts and the bulb head. Also, the methods of affixing the elements together is explained. These elements are compared to the USPTO classifications that are relevant. First the classification code(s) and description are given. Then FIG. 12 arrowed numbers are linked to it and explained. This utility patent is not making claims on any of the classifications below except for light intensity and the change in light intensity. The LEDs on the LED PCB and the circuitry that dims and brightens the LEDs on the main PCB are involved. The patent is answering how the classifications were accomplished since this is a prototype. The main PCB and the LED PCB are 56.0 mm diameter with a 3.7 mm hole in the center and a thickness of 0.062 inches for each. It has plated through holes, solder mask and yellow color and is two sided for tracks. The bolt going through the holes is #6-32. And #6-32 nuts are used. The distance between the two PCB's is approximately 16.7 mm.

H05B 33/0803 {for light emitting diodes [LEDs] comprising only inorganic semiconductor materials}
F21Y 2115/10 Light-emitting diodes [LED]
1240 On the top of the LED PCB, the surface mount LEDs are mounted
H05B 33/0845 {of the light intensity}
1240 On top of the LED PCB are the LEDs. The LED's light intensity is given as on the datasheet. For 50 mA it is 40 lumens. The device runs at 40 mA giving 32 lumens per LED.
There are 17 LEDs×32 lumens=544 lumens. The LED Bulb also varies light intensity by brightening and dimming, which is a main topic of this utility patent and is explained in this document.
H05B 33/0857{of the color point of the light}
1240 On top of the LED PCB, the colour point of the warm white LEDs found in the datasheet and is between 2800K to 3200K. So the average colour temperature is 3000K
F21K 9/232 . . . specially adapted for generating an essentially
omnidirectional light distribution, e.g. with a glass bulb
1240 On top of the LED PCB, the LEDs shine through 1250 a plastic translucent spherical bulb. This is Taken from an existing LED bulb, to give omnidirectional light distribution.
F21V 19/003 {Fastening of light source holders, e.g. of circuit boards or substrates holding light sources}
1215 The main PCB is held to 1205 the base by 1210 silicon caulking. 1215 The main PCB is held to 1230 the LED PCB by 1225 a #6-32 bolt where the distance between 1215 the main PCB and 1230 the LED PCB is 16.7 mm. 1235 The nut holds the assembly together. There is 1225 a hex cap on the bolt on the other side of 1215 the main PCB. The nuts are screwed to 1225 the bolt at 1220 the top of the main PCB and 1230 the bottom of the LED PCB. They are then glued on, by Krazy Glue on but not shown. This makes the assembly rigid. Then 1240 the LED PCB top, is connected to 1250 the bulb by 1245 Gorilla Super Glue.
F21K 9/235 . . . Details of bases or caps, i.e. the parts that connect the light source to a fitting;
Arrangement of components within bases or
Caps
1205 For this prototype the base was taken from an existing LED bulb. 1215 And the main PCB was connected to 1205 the base by 1210 silicon calking. 1250 For this protype, the bulb was taken from an existing LED Bulb. 1240 And the top of the LED PCB was connected to 1250 bulb by 1245 Gorilla Super Glue.
F21K 9/238 . . . Arrangement or mounting of circuit elements
integrated in the light source
1215 The main PCB 1220 on the top is populated with through hole components only.
1230 The LED PCB 1240 on top is populated with surface mount components only. These are the warm white LED's and the LED current control IC.
Y02B 20/383 . . . Adaptation to Edison sockets
F21V 19/006. {of point-like light sources, e.g. incandescent or
halogen lamps, with screw-threaded or bayonet base
1200 The screw-threaded male is the Edison E26 which is connected to 1205 base. For the demo the 1200 Edison E26 male is screwed into the E26 female with a two-prong male for 120V, 60 Hz mains. This is plugged into the Leviton 1470 AC mains switch used as the light switch. And the other side is plugged into an extension cord that is plugged into the wall outlet. 1205 Inside the base 1200 the Edison screw has two wires hot and neutral which are connected to 1215 the main PCB. 1215 The main PCB has three wires connected to 1230 the LED PCB. They are 165 VDC, ground and the dim control signal.
H05B 33/0851 {with permanent feedback from the light source}
This embodiment does not use feedback from the light source to dim or brighten or any other reason.
H05B 33/0815 {with a controlled switching regulator}
This embodiment does not use a switching regulator although we did try 120 VAC to 5 VDC USB module but it was an OEM module and was only used experimentally in a previous provisional patent.
H05B 33/08 Circuit arrangements not adapted to a particular Application
This embodiment did not have this.

So, the LED bulb contents and construction has been explained by use of the view of FIG. 12. As well, the demo setup was explained as an extension of the Edison E26 male screw. The four mp4 videos of the demo have not been included in this EFS-Web filed patent but are available to be seen. It shows light switch switching that puts the bulb in Dimming Mode, locks in the dim point and puts the bulb in Normal Mode for regular use. The four mp4's give different brightening and dimming patterns. Which would complete the presentation of the patent information.

Firmware Program

The Program is a sequence of instructions and routines. The program listing may be either in machine or machine-independent (object or source) language which will perform a desired procedure or task such as, regulate the flow of work, or control or monitor events. The program in this patent does this. Any listing having more than 60 lines and less than 300 lines of code that is submitted as part of the specification must be positioned at the end of the description but before the claims.

The following gives the Firmware Program loaded into the Microcontroller. It is commented for comprehension. As shown, FIG. 11 the LED bulb has various dimming patterns. This program is for the dimming pattern found in FIG. 11D. The brighten then dim then brighten then dim pattern, also known as HLHL. Since Programs can be included in the Specification this Firmware Program is included. For each of the four dimming patterns we use separate Microcontroller Firmware programs.

```
/* ***********************************************************************
Company: Zetaware MICROCONTROLLER EMBEDDED FIRMWARE PROGRAM
Developer: Michael Treciokas
Method: starts in normal mode which is constant brightness
Function: This pattern start of in normal mode which is constant. This code
version dims the LED via pulses. The dimming pattern
selection goes from brightest to dimmest. The initial pattern starts at brightest
for a while to lock in the brightest then start dimming. So the dimming
pattern is from brightest to dimmest and then repeats. HLHL Date: 08/12/2019
************************************************************************/
#include <math.h>
#include "mcc_generated_files/mcc.h"
#include "mcc_generated_files/interrupt_manager.h"
#include "mcc_generated_files/pin_manager.h"
#include "mcc_generated_files/memory.h"
// Main application
void main(void) {
    EPWM1_Initialize( );
    // initialize the device
    SYSTEM_Initialize( );
    // When using interrupts, you need to set the Global and Peripheral Interrupt Enable bits
    // Use the following macros to
    // Enable the Global Interrupts
    INTERRUPT_GlobalInterruptEnable( );
    // Enable the Peripheral Interrupts
    INTERRUPT_PeripheralInterruptEnable( );
    // initialize the module
    TRISAbits.TRISA4 = 1;
    TRISAbits.TRISA5 = 0;
    // write to an EMBEDDED EEPROM Device
    uint8_t ProgramMode;
    uint8_t DelayTick;
    uint8_t PowerOn;
    uint16_t counter, timeOut;
    int16_t countdown;
    //////////////////////////////////////////
    uint8_t rBright;
    uint8_t rDirection;
    //////////////////////////////////////////
    float time;
    float ltime;
    uint8_t delay;
    uint8_t delayinc;
    delayinc = 20;
    ProgramMode = false; //not in dimming mode
    RA5 = false; //LED indicator is off not in dimming mode
    //////////////////////////////////////////
    rBright = DATAEE_ReadByte(0); // Brightness intensity.
    rDirection = DATAEE_ReadByte(1); // LED brightness direction
    //////////////////////////////////////////
while (true){ // infinite loop
    PowerOn = RA4; //Whether or not dimming mode from external pin.
    //choose one of two start points either LOW or HIGH
    //******************Cycling high To low start position*******
    counter = 255; //High TO Low
    countdown = -1; // Time down
    //*************************************************************
//while (true) {
while(PowerOn == true){ // If power on then loop
    PowerOn = RA4; //If power on then LEDs on.
    if (ProgramMode == false){ // not in dimming cycles constant mode or
                // or in regular mode.
        RA5 = false; // turn off dimming mode LED
        //////////////////////////////////////////
            counter = rBright; //High TO Low
        if (rDirection == 1){ // counting up LED pattern
            countdown = 1;}
        else {         // counting down LED light brightness pattern
```

```
        countdown = −1;}
    EPWM1_LoadDutyValue(counter); //Get brightness intensity lock in value
}
delay = 20;
if (Program Mode == true){ // Starts dimming pattern for light
                // to dimmest so you can select intensity
// counter = counter + countdown; changing light brightness
    RA5 = true; // turn the dimming led ON
    if (counter == 255) { //Stay at max for a while
        _delay_ms(500); // how long to stay at this brightness
        EPWM1_LoadDutyValue(0); // load in pulses.
                _delay_ms(500);
        EPWM1_LoadDutyValue(255); // load in Pulses.
                _delay_ms(500);
    EPWM1_LoadDutyValue(0); // load in Pulses.
                _delay_ms(500);
        EPWM1_LoadDutyValue(255); // load in Pulses
            _delay_ms(500);
    }
    else if (counter >= 50){
        for(delay = 0; delay < 50; delay++){ // increase delay times.
        _delay_us(200);} // delay is gradually increased more for lower brightness
    }
    else if (counter < 50){
        for(delay = 0; delay < 250; delay++){ // increase delay times.
        _delay_us(250);} // delay is gradually increased more for lower brightness
        if (counter <= 2){
            for(delay = 0; delay < 250; delay++){ // increase delay times.
            _delay_us(250);}}
    }
    EPWM1_LoadDutyValue(counter); // load in Pulses.
    PowerOn = RA4;
        if (PowerOn == true){
        counter = counter + countdown; // changing light brightness
    }
    if (counter <= 0) { // counter roll over to repeat cycle
        countdown = −1;
        counter = 255;
    }
///////////////////////////////////////
rBright = counter; // Current brightness.
if (countdown == 1){ // Save direction of brightness
    rDirection = 1;}
else {
    rDirection = 0;
}
DATAEE_WriteByte(0, rBright); // Wright brightness in E2prom
DATAEE_WriteByte(1, rDirection); // Save up or down in E2prom
    PowerOn = RA4; // See if power still on.
}
// ***** One second after power fail *****************************
    PowerOn = RA4; // See if power still on
    // Detect On Off On pattern to get into dimming mode
    if (Program Mode == false){
    for (DelayTick = 0; ((DelayTick <= 150) && (PowerOn == false)); DelayTick++){
        _delay_ms(20); // simple delay in time.
        Program Mode = true; // quick toggle now in dimming mode
            PowerOn = RA4;      // Checking for power to see if any changes
//      RA5 = true;
            counter = 255; //High TO Low reset counter
            countdown = −1;// Counting down starting from 255 counter.
        }
        // ****** Over one second after power fail*************************
        while(PowerOn == false){ //Power off to long no longer in dimming mode.
            ProgramMode = false; //Non dimming mode on next power up
            PowerOn = RA4; //Check for power on for expired dimming mode
//          RA5 = false;
        }
    }
        else { //ProgramMode = true)
        for (DelayTick = 0; ((DelayTick <= 150) && (PowerOn == false)); DelayTick++){
            _delay_ms(20); // simple delay in time.
            ProgramMode = false; // quick toggle now in dimming mode
            PowerOn = RA4;      // Checking for power to see if any changes
//      RA5 = true;
            counter = 255; //High TO Low reset counter
        countdown = −1;// Counting down starting from 255 counter.
    }
        // ****** Over one second after power fail*************************
```

```
         while(PowerOn == false){ //Power off to long no longer in dimming mode.
             Program Mode = false; //Non dimming mode on next power up
             PowerOn = RA4; //Check for power on for expired dimming mode
         }
       }
     }
   }
 }
}
// End of File
```

The invention claimed is:

1. An LED Dimmer Bulb, comprising:
   a) an E26 Edison Screw for mating with a light bulb socket connected to a light switch;
   b) an AC to DC Converter circuit, having a bridge rectifier and a large capacitor producing 165 VDC;
   c) an LED Chain circuit for producing warm white light;
   d) a 5V Regulator circuit for producing current;
   e) a Microcontroller circuit having Embedded Firmware for controlling processes of light brightness;
   f) a Diode Capacitor circuit for backup power to said microcontroller when said light switch is OFF for a brief time;
   g) an indicator LED Circuit to indicate said bulb is dimming;
   h) a Bipolar Junction Transistor or BJT circuit to produce current;
   i) an LED Current Control IC circuit to produce current at a high voltage;
   j) wherein said E26 Edison screw sends 120 VRMS 60 Hz to said AC to DC Converter circuit when the light switch is ON;
   k) wherein said AC to DC converter sends 165 VDC to said 5V regulator;
   l) wherein said AC to DC converter sends 165 VDC to said LED chain;
   m) wherein said 5V regulator circuit sends 5V with low current to said microcontroller;
   n) wherein said microcontroller sends 4.8V and Ground pulses to said Bipolar Junction Transistor circuit;
   o) wherein said BJT circuit sends a pulsed current to said LED Current Control IC for setting said LED Chain brightness;
   p) wherein said LED Current Control IC sends the same pulsed current to said LED chain with a voltage of 165 VDC.

2. The LED Dimmer Bulb of claim 1 wherein said LED Chain was determined by voltage across each LED of 9.5V times 17 LED's gives a 3.5 VDC drop across the said IC LED Driver, operating current of 40 mA and displays Warm white light.

3. The LED Dimmer Bulb of claim 1 wherein said 5V regulator circuit was determined by current required for the Microcontroller, the input resistor produces a voltage drop to about 90 VDC, that said regulator can handle.

4. The LED Dimmer Bulb of claim 1 wherein said 5V regulator circuit output has a pull-down resistor that is small enough so when the power is turned off, 5V from said regulator goes to ground quickly for detecting OFF by said microcontroller.

5. The LED Dimmer Bulb of claim 1 wherein said Diode Capacitor circuit uses said diode with a low voltage drop of 0.2V and said large capacitor that will power the microcontroller for over half a second with given current when power is OFF for back-up temporary power setting the Microcontroller supply voltage at 4.8V.

6. The LED Dimmer Bulb of claim 1 wherein said LED indicator circuit uses said 5 mm LED of sufficient brightness and current and voltage so the resistor produces the additional voltage drop to make 4.8V.

7. The LED Dimmer Bulb of claim 1 wherein said Microcontroller output provides a 4.8V-ground pulsed signal to the base resistor of the BJT circuit.

8. The LED Dimmer Bulb of claim 1 wherein said BJT circuit uses an NPN transistor for ease of switching with said Microcontroller which goes from 4.8V to ground.

9. The BJT circuit of claim 8 wherein said Bipolar Junction Transistor has a small collector to emitter saturation voltage $V_{CE(SAT)}$ to get required current in saturation.

10. The BJT circuit of claim 9 further given said base resistor current, the collector current is high enough to drive the BJT Transistor into saturation. (short-circuit with said $V_{CE(SAT)}$=0.125V drop) providing current to LED Chain.

11. The BJT Circuit of claim 10 further given the emitter of the BJT NPN transistor is grounded so when said Microcontroller output is ground the BJT goes into cut-off (open circuit). Providing zero current.

12. The LED Dimmer Bulb of claim 1 wherein said LED Current Control IC circuit sends current to BJT switching collector and duplicates it in said LED Current Control IC, to drive said 165 VDC LED Chain.

13. The LED Current Control IC Circuit of claim 12 further through experimentation the resistor between said BJT collector and said LED Current Control IC was found to be zero for required 40 mA DC current to LED Chain at maximum brightness.

14. A method for operating an LED Dimmer Bulb comprising:
   a) a light switch for an input device;
   b) a memory Device for saving desired brightness or dim point;
   c) a Programming method for running an Algorithm flowchart reflecting the method of use;
   d) an output signal to send light levels to said bulb;
   e) a way of dimming and brightening the bulb;
   f) a way of displaying the desired brightness or dim point;
   whereby said light switch is turned ON and OFF in a pattern, signals said algorithm to brighten, dim, in dimming mode and select said desired brightness or dim point to be displayed in normal mode.

15. The method of claim 14 wherein said memory storage device is the Microcontroller EEPROM.

16. The method of claim 14 wherein said Algorithm program is achieved by Microcontroller FLASH Embedded Firmware.

17. The method of claim 14 wherein said light switch is an On-OFF control signal and sends a logic signal to said microcontroller Embedded Firmware to send a signal to display light brightness's through said LED Bulb.

18. The Method of claim 14 wherein said Embedded Firmware produces a pulsed signal of a frequency of 1.98 kHz, high enough to prevent the LED chain flickering.

19. The method of claim 14 wherein said LED Bulb 100% maximum brightness is done by said microcontroller Embedded Firmware.

20. Said microcontroller Embedded Firmware of claim 19 further sends a 4.8V signal of 100% on-time or high to produce 40 mA current to said LED Chain in saturation.

21. The method of claim 14 wherein said LED Bulb with no light, or 0% brightness is done by said microcontroller Embedded Firmware.

22. Said Microcontroller Embedded Firmware of claim 21 further sends a ground signal or 0% on-time or low to produce no current to said LED Chain in cut off.

23. The method of claim 14 wherein said LED Bulb brightening is done by said microcontroller Embedded Firmware.

24. Said Microcontroller Embedded Firmware of claim 23 further sends a pulsed signal where the percentage ON time or Duty Cycle of the pulse increases from 0% to 100% for brightening.

25. Said Microcontroller Embedded Firmware of claim 24 further sends a pulsed signal where the percentage ON time or Duty Cycle is linear producing linear brightness.

26. The method of claim 14 wherein said LED Bulb dimming is done by said microcontroller Embedded Firmware.

27. Said Microcontroller Embedded Firmware of claim 26 further sends a pulsed signal where the ON time or Duty Cycle of the pulse decreases from 100% to 0% for dimming.

28. Said Microcontroller Embedded Firmware of claim 27 further sends a pulsed signal where the percentage ON time or Duty Cycle is linear producing linear dimming or brightening.

29. Said Microcontroller Embedded Firmware of claim 28 sends pulses at a set frequency and linearly increases and decrease on-time to linearly brighten or dim said bulb in about 10 seconds.

30. The method of claim 14 wherein turning said light switch ON then OFF and ON within half a second signals said Embedded Firmware to dim and/or brighten the said LED bulb in a cycle.

31. The method of claim 14 wherein while the said LED bulb is cycling, turning said light switch OFF and ON for longer than two seconds, signals said Embedded Firmware to set and display the desired brightness or dim point and save it in said EEPROM.

32. The Diode Capacitor of claim 5 wherein during dimming mode said diode-capacitor sub-circuit holds power at the microcontroller so said Embedded Firmware can save said desired brightness or dim point to said EEPROM.

33. The method of claim 14 wherein during normal mode, turning said light switch ON and OFF for longer than two seconds, signals said Embedded Firmware to display desired brightness or dim point read from said EEPROM.

34. A Method for Microcontroller Embedded Firmware to display light level patterns comprising:
  a) an LED bulb to display the light level patterns;
  b) a light switch switching pattern for Embedded Firmware to run dimming mode routines with four choices;
  c) blinking wherein said bulb starts with at maximum brightness then immediately goes to no light, then repeats again, all in two second;
  d) a dimming pattern wherein said bulb starts at maximum brightness and decrease to no light;
  e) a brightening pattern wherein said bulb starts at no light and increases to maximum brightness;
  f) setting brightness wherein the light switch is turned OFF and ON after two seconds and said bulb displays the desired brightness or dim point in normal mode.

35. The method of claim 34 wherein said Microcontroller Embedded Firmware puts said LED Bulb in dimming mode by turning the light switch ON-OFF-ON within half a second.

36. The method of claim 34 wherein said Microcontroller Embedded Firmware enters dimming mode, starts said blinking, said brightening pattern, then repeats indefinitely until said setting brightness is selected.

37. The method of claim 34 wherein said Microcontroller Embedded Firmware enters dimming mode, starts said blinking, said dimming pattern, then repeats indefinitely until said setting brightness is selected.

38. The method of claim 34 wherein said Microcontroller Embedded Firmware enters dimming mode, starts said blinking, said dimming pattern, then said blinking, then said brightening pattern and repeats indefinitely until said setting brightness is selected.

39. The method of claim 34 wherein said Microcontroller Embedded Firmware enters dimming mode, starts said blinking, said brightening pattern, then said blinking, then said dimming pattern and repeats indefinitely until said setting brightness is selected.

40. The method of claim 34 wherein said Embedded Firmware dimming pattern dims linearly.

41. The method of claim 34 wherein said Embedded Firmware brightening pattern brightens linearly.

42. The method of claim 34 wherein said Embedded Firmware dimming pattern takes ten seconds, an appropriate amount of time to eliminate waiting and select a precise desired brightness or dim point.

43. The method of claim 34 wherein said Embedded Firmware brightening pattern takes ten seconds, an appropriate amount of time to eliminate waiting and select a precise desired brightness or dim point.

* * * * *